US011145612B2

(12) United States Patent
Guevara, III

(10) Patent No.: US 11,145,612 B2
(45) Date of Patent: Oct. 12, 2021

(54) METHODS FOR BUMP PLANARITY CONTROL

(71) Applicant: TEXAS INSTRUMENTS INCORPORATED, Dallas, TX (US)

(72) Inventor: Rafael Jose Lizares Guevara, III, Manila (PH)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 15 days.

(21) Appl. No.: 15/856,236

(22) Filed: Dec. 28, 2017

(65) Prior Publication Data

US 2019/0206820 A1 Jul. 4, 2019

(51) Int. Cl.
*H01L 23/00* (2006.01)

(52) U.S. Cl.
CPC ............. *H01L 24/11* (2013.01); *H01L 24/06* (2013.01); *H01L 24/13* (2013.01); *H01L 24/14* (2013.01); *H01L 24/05* (2013.01); *H01L 24/94* (2013.01); *H01L 2224/024* (2013.01); *H01L 2224/0231* (2013.01); *H01L 2224/0237* (2013.01); *H01L 2224/02126* (2013.01); *H01L 2224/0347* (2013.01); *H01L 2224/0603* (2013.01); *H01L 2224/06102* (2013.01); *H01L 2224/10126* (2013.01); *H01L 2224/11001* (2013.01); *H01L 2224/11015* (2013.01); *H01L 2224/1146* (2013.01); *H01L 2224/1147* (2013.01); *H01L 2224/11622* (2013.01); *H01L 2224/11849* (2013.01); *H01L 2224/13014* (2013.01); *H01L 2224/13024* (2013.01); *H01L 2224/1357* (2013.01); *H01L 2224/13082* (2013.01); *H01L 2224/13147* (2013.01); *H01L 2224/13582* (2013.01); *H01L 2224/13611* (2013.01); *H01L 2224/13639* (2013.01); *H01L 2224/13647* (2013.01); *H01L 2224/1403* (2013.01); *H01L 2924/014* (2013.01); *H01L 2924/07025* (2013.01); *H01L 2924/14* (2013.01); *H01L 2924/3841* (2013.01)

(58) Field of Classification Search
CPC ......... H01L 24/11; H01L 24/13; H01L 24/14; H01L 2224/023; H01L 2224/03001–03009; H01L 2224/039–03906; H01L 2224/13575–13584; H01L 2224/13583–13584; H01L 2224/0401; H01L 2224/1403
See application file for complete search history.

(56) References Cited

U.S. PATENT DOCUMENTS 6,348,401 B1 2/2002 Chen et al.
8,860,222 B2 * 10/2014 Khandekar ............. H01L 23/29
257/758

(Continued)

*Primary Examiner* — Laura M Menz
*Assistant Examiner* — Candice Chan
(74) *Attorney, Agent, or Firm* — Dawn Jos; Charles A. Brill; Frank D. Cimino

(57) ABSTRACT

A method for manufacturing an integrated circuit package includes depositing a first layer of metal at a location of a first metal post that is for connecting an IC die to an external circuit. The method also includes depositing a second layer of metal at the location of the first metal post, and a first layer of metal at a location of a second metal post that is for connecting the IC die to an external circuit.

17 Claims, 6 Drawing Sheets

(56) References Cited

U.S. PATENT DOCUMENTS

| | | | |
|---|---|---|---|
| 2002/0070440 A1* | 6/2002 | Aiba | H01L 23/3107 |
| | | | 257/690 |
| 2002/0139976 A1* | 10/2002 | Hembree | H01L 22/20 |
| | | | 257/48 |
| 2012/0043654 A1* | 2/2012 | Lu | C25D 5/10 |
| | | | 257/737 |
| 2013/0193569 A1* | 8/2013 | Han | H01L 24/03 |
| | | | 257/737 |
| 2014/0159235 A1* | 6/2014 | Odaira | H01L 24/13 |
| | | | 257/737 |
| 2015/0364436 A1* | 12/2015 | Yu | H01L 24/13 |
| | | | 438/614 |

* cited by examiner

METHODS FOR BUMP PLANARITY CONTROL

BACKGROUND

Some integrated circuit (IC) packaging technologies (e.g., flip-chip packaging) utilizes bumps rather than wirebonding to establish electrical contact between an IC die and the substrate or lead frame of a package, or another integrated circuit. Structurally, a bump is made up of the bump itself and a under bump metallization layer located between the bump and an I/O pad of the IC die. The bumps themselves, based on the material used, can be classified as solder bumps, gold bumps, copper pillar (or copper post) bumps and bumps with mixed metals. In copper pillar (or copper post) bump technology, instead of using a solder bump, an IC die is connected to a substrate or other external circuitry by copper post bumps. Copper post bumps allow finer I/O pitches than solder bumps, with reduced probability of bump bridging and reduced capacitive loading.

SUMMARY

An integrated circuit package and methods for manufacturing the package are disclosed herein. In one example, a method for manufacturing an integrated circuit package includes depositing a first layer of metal at a location of a first metal post that is for connecting an integrated circuit die to an external circuit. The method also includes concurrently depositing a second layer of metal at the location of the first metal post, and a first layer of metal at a location of a second metal post that is for connecting the IC die to an external circuit.

In another example, an integrated circuit package includes a redistribution layer and a plurality of conductive bumps. The conductive bumps are formed on the redistribution layer to connect an IC die to an external circuit. A first of the bumps includes a metal post. The metal post includes a first metal layer extending from the redistribution layer, and a second metal layer deposited on and extending from the first metal layer.

In a further example, a method for constructing an integrated circuit integrated circuit package includes forming a redistribution layer on an integrated circuit die. Forming the redistribution layer includes depositing a first layer of photoresist material on the integrated circuit die. The first layer of photoresist material is removed from input/output pads of the integrated circuit die. A first layer of metal is deposited on the photoresist material and the input/output pads of the integrated circuit die. A second layer of photoresist material is deposited on the first layer of metal. The second layer of photoresist material is removed to expose portions of the first layer of metal. The first layer of metal is etched to form connections between a first of the input/output pads of the integrated circuit die and a location of a first metal post, and a second of the input/output pads of the integrated circuit die and a location of a second metal post. After the etching, a third layer of photoresist material is deposited on the integrated circuit die. The third layer of photoresist material is removed from the location of the first metal post and the location of the second metal post. A fourth layer of photoresist material is applied to the integrated circuit die. The fourth layer of photoresist material is removed to expose, on the redistribution layer, the location of the first metal post, and to cover, on the redistribution layer, the location of the second metal post. The first metal post has a first cross sectional area, and the second metal post has a second cross sectional area. The second cross sectional area is larger than the first cross sectional area. A first layer of copper is deposited, while the fourth layer of photoresist material is in place, to construct the first metal post. The fourth layer of photoresist material is removed. A fifth layer of photoresist material that exposes the location of the first metal post and the location of the second metal post is deposited on the integrated circuit die. The fifth layer of photoresist material is thicker than the fourth layer of photoresist material. A second layer of copper is deposited to construct the first metal post and the second metal post while the fifth layer of photoresist is in place.

BRIEF DESCRIPTION OF THE DRAWINGS

For a detailed description of various examples, reference will now be made to the accompanying drawings in which.

DETAILED DESCRIPTION

Certain terms have been used throughout this description and claims to refer to particular system components. As one skilled in the art will appreciate, different parties may refer to a component by different names. This document does not intend to distinguish between components that differ in name but not function. In this disclosure and claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device couples to a second device, that connection may be through a direct connection or through an indirect connection via other devices and connections. The recitation "based on" is intended to mean "based at least in part on." Therefore, if X is based on Y, X may be a function of Y and any number of other factors.

While integrated circuit input/output using bump terminals provides a number of advantages, use of bump terminals is not without issue. Many assembly and reliability issues are caused by tilted dies, solder voids and non-wets. These defects are in turn often caused by the condition of the wafers during bumping. Bump feature size is one factor that affects plating thickness. As bump feature size increases, plated thickness also increases. Given that a die includes multiple bump feature sizes, the plating thickness associated with the different feature sizes varies, and the device bumps can consequently exhibit planarity issues that cause die tilt, solder voids, etc. Thus, poor bump planarity is one cause of poor package reliability.

Implementations of the present disclosure include methods for manufacturing an integrated circuit with equalized bump height. Implementations apply multiple layers of metal to construct bump terminals. At least one layer of the multiple layers of metal is applied to compensate for the difference in bump height attributable to different bump feature sizes of the integrated circuit. By equalizing the height of the various bumps of the integrated circuit, Implementations avoid the solder voids and other problems associated with poor bump planarity.

Figure 1:
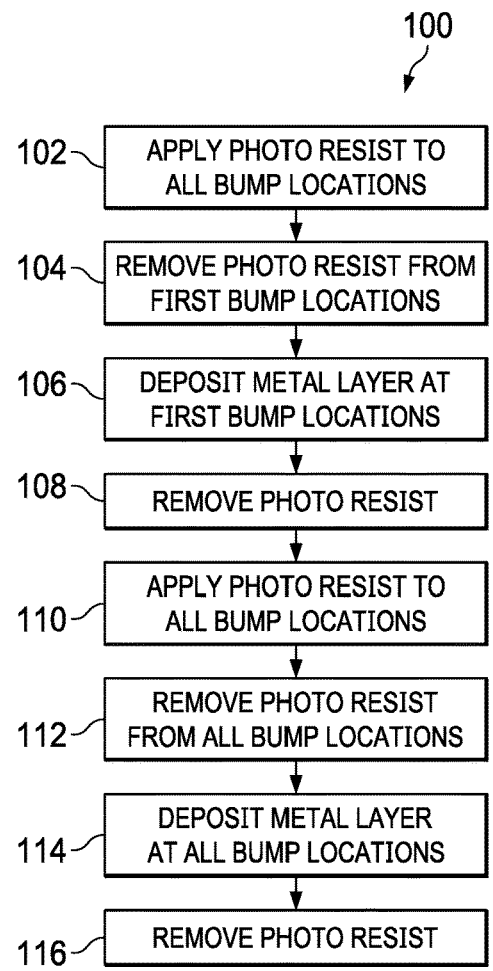
FIG. 1 shows a flow diagram for a method for manufacturing an integrated circuit with bump height equalization in accordance with various examples.

FIG. 1 shows a flow diagram for a method 100 for manufacturing an integrated circuit with bump height equalization in accordance with various examples. Though depicted sequentially as a matter of convenience, at least some of the actions shown can be performed in a different order and/or performed in parallel. Additionally, some Implementations may perform only some of the actions shown.

Figure 2:
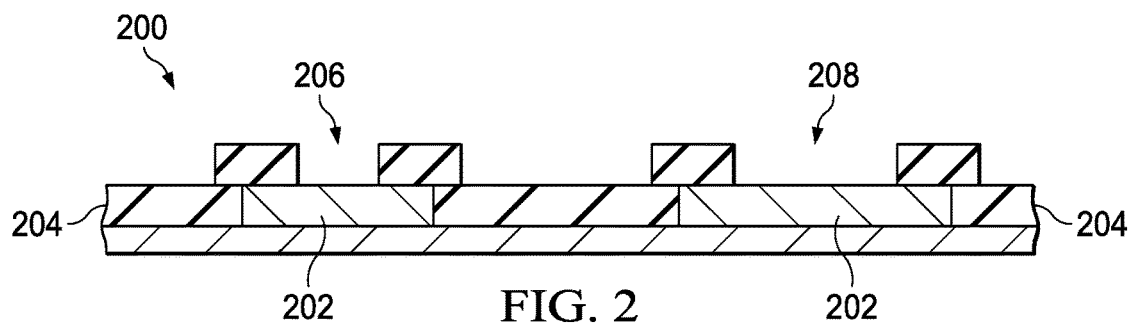
FIG. 2 shows an integrated circuit die prepared for construction of bumps of different sizes in accordance with various examples.

In block 102, an integrated circuit die has been prepared for bump formation. FIG. 2 shows the integrated circuit die 200 prepared for construction of bumps of different sizes in accordance with various examples. The integrated circuit die 200 may include a redistribution layer 202 on which the bumps are to be formed, and a polyimide layer polyimide layer 204 that isolates the redistribution layer 202. An opening 206 in the polyimide layer 204 allows for formation of a first bump and an opening 208 in the polyimide layer 204 allows for formation of a second bump. The area of the opening 208 is greater than the area of the opening 206. Consequently, the cross-sectional area of a bump formed at the opening 208 will be greater than the cross-sectional area of a bump formed at the opening 206. As a result in the difference in cross-sectional area, the height of a bump formed at the opening 208 will be greater than the height of a bump formed at the opening 206 by deposition of a single layer of metal. The method 100 compensates for the difference in bump height produced by conventional IC processing. While FIG. 2 illustrates a single opening 206 and a single opening 208, in practice the integrated circuit die 200 may include any number of openings 206 and any number of openings 208 each corresponding to a bump.

Figure 3:
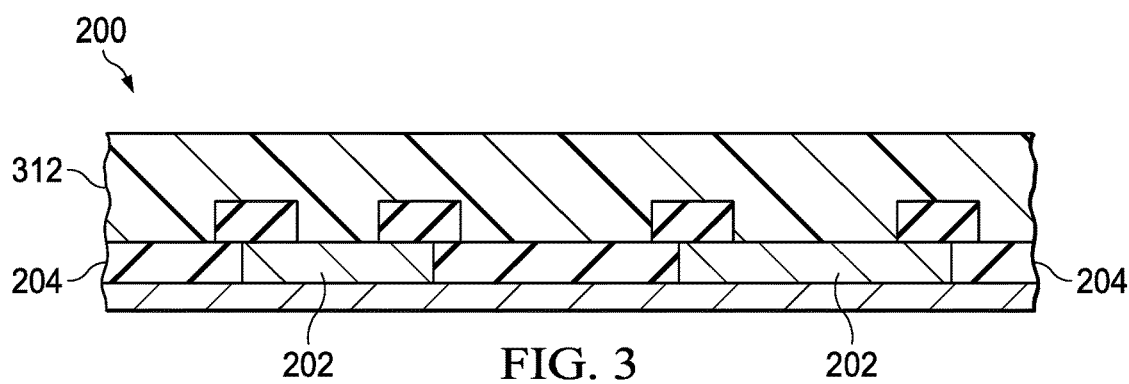
FIG. 3 shows a photoresist material applied to the die in preparation for application of first layer of metal to the bumps in accordance with various examples.

In preparation for construction of bumps on the integrated circuit die 200, a layer of photoresist material is applied to the integrated circuit die 200. FIG. 3 shows the photoresist material 312 applied to the integrated circuit die 200 in preparation for application of first layer of metal.

Figure 4:
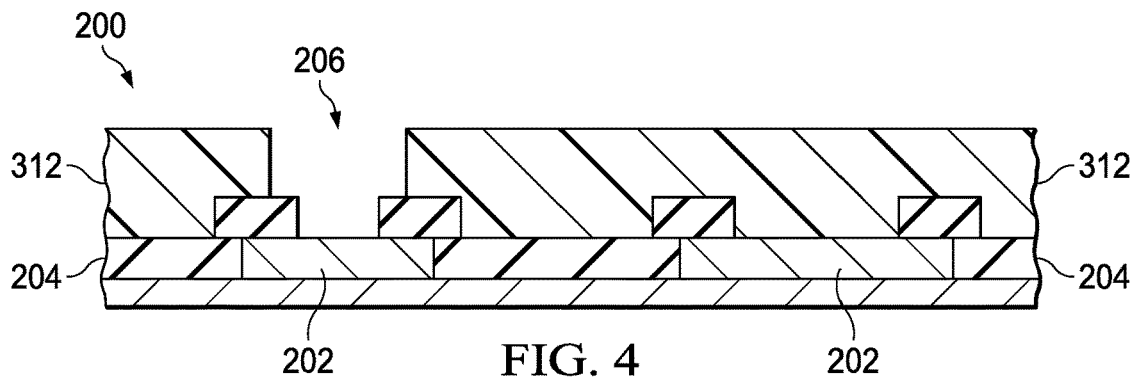
FIG. 4 shows the die with photoresist material removed from bump locations selected for plating with layer of metal in accordance with various examples.

In block 104, the photoresist material 312 applied to the integrated circuit die 200 in block 102 is removed from the opening 206 to allow addition of metal at the opening 206. FIG. 4 shows the photoresist material 312 removed from the opening 206. The opening 208 remains covered by the photoresist material 312 to prevent addition of metal at the opening 208.

Figure 14:
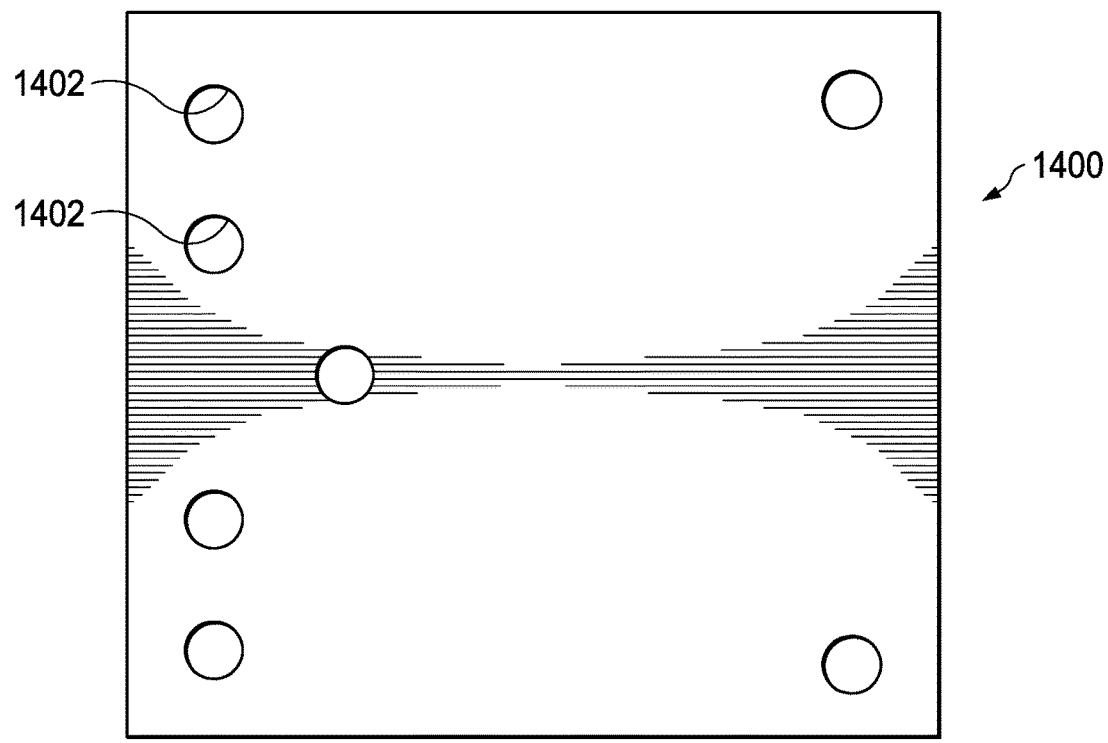
FIG. 14 shows a reticle pattern applied to remove the photoresist material from selected bump locations in accordance with various examples.

FIG. 14 shows an example of a reticle pattern 1400 that may be applied to remove the photoresist material 312 from the opening 206 and any number of additional bump locations of a same area as the opening 206 while leaving the opening 208 and any number of additional bump locations of a same area as the opening 208 covered by the photoresist material 312. The reticle pattern 1400 includes an opening 1402 that corresponds to the opening 206 and lacks an opening corresponding to the opening 208.

Figure 5:
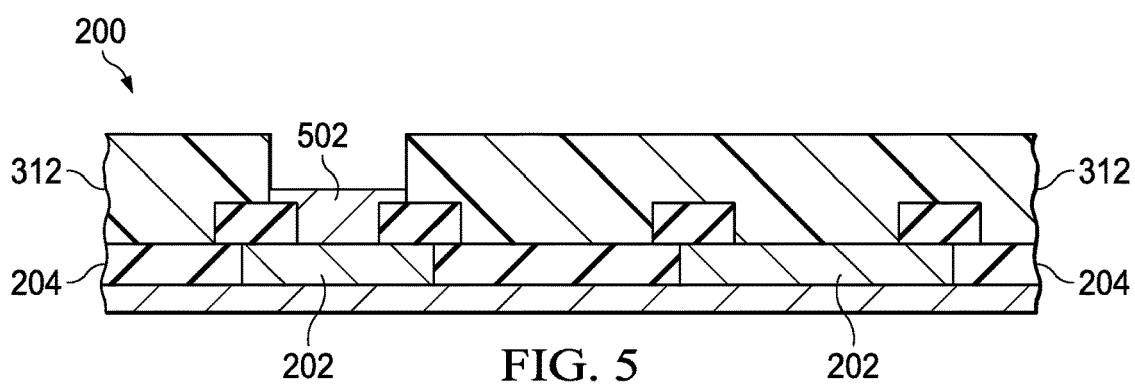
FIG. 5 shows the die with a layer of metal applied to the selected bump locations in accordance with various examples.

In block 106, a layer of metal is deposited at the opening 206 to form a bump (i.e., a metal post) at the opening 206. FIG. 5 shows a layer of metal 502 deposited at the opening 206. The layer of metal 502 is copper is some implementations. The thickness of the layer of metal 502 is selected to compensate for the difference in height of a bump formed at the opening 206 and a bump formed at the opening 208 if a single layer of metal is applied to the integrated circuit die 200 that produces a bump of a given height at the opening 208. The photoresist material 312 prevents deposition of metal at the opening 208.

Figure 6:
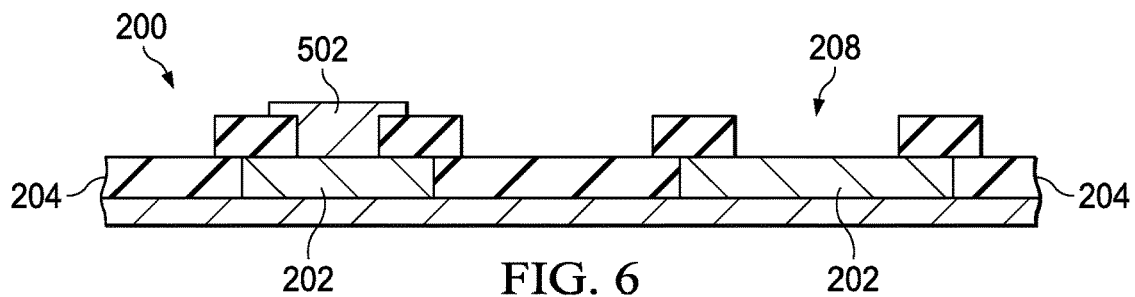
FIG. 6 shows the die stripped of photoresist material after deposition of the metal layer in accordance with various examples.

In block 108, the photoresist material 312 deposited on the integrated circuit die 200 in block 102 is removed from the integrated circuit die 200. FIG. 6 shows the integrated circuit die 200 stripped of the photoresist material 312 after deposition of the layer of metal 502.

Figure 7:
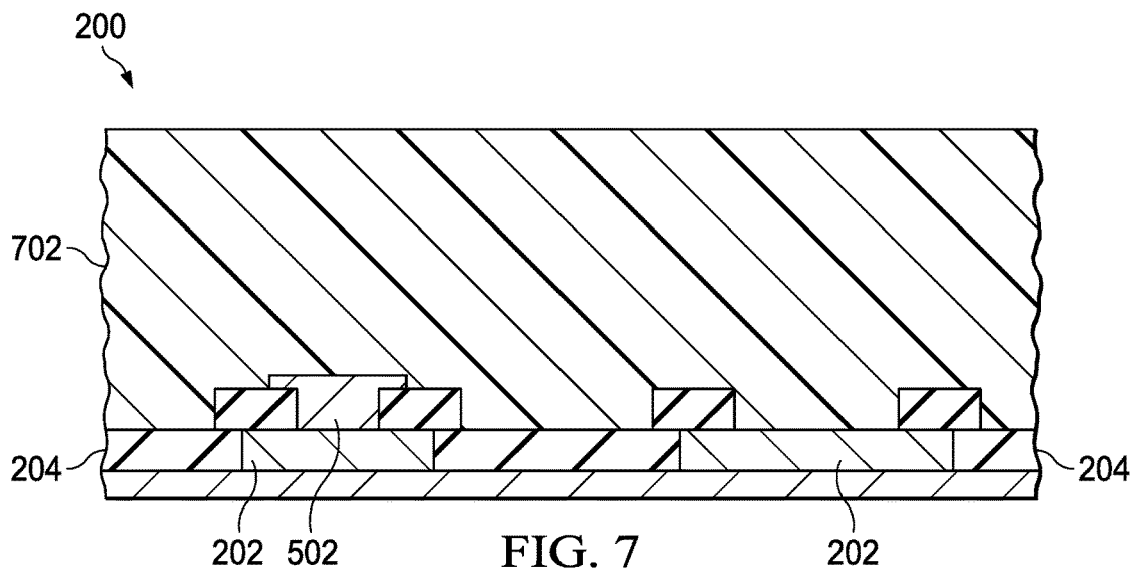
FIG. 7 shows a photoresist material applied to the die in preparation for application of second layer of metal to the bumps in accordance with various examples.

In block 110, a second layer of photoresist material is deposited on the integrated circuit die 200. The second layer of photoresist material may be thicker than the layer of photoresist material applied in block 102. FIG. 7 shows the second layer of photoresist material 702 applied to the integrated circuit die 200. The photoresist material 702 covers the opening 208 and covers the layer of metal 502 at the opening 206. The thickness of the second layer of photoresist material 702 may be greater than the thickness of the photoresist material 312.

Figure 8:
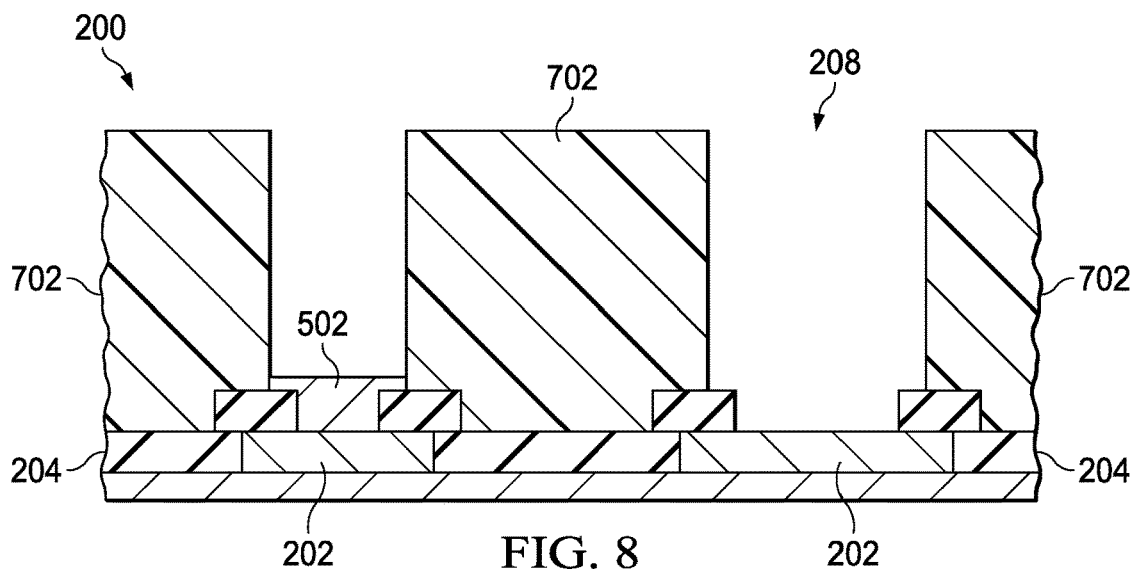
FIG. 8 shows the die with photoresist material removed from all bump locations for plating with a layer of metal in accordance with various examples.

In block 112, the photoresist material 702 applied in block 110 is removed from the opening 208 and from the layer of metal 502 at the opening 206 to allow addition of metal at the opening 208 and to the layer of metal 502 at the opening 206. FIG. 8 shows the photoresist material 702 removed from the opening 208 and from the layer of metal 502 at the opening 206 for plating with a layer of metal. In practice, the photoresist material 702 may be removed from all bump locations on the integrated circuit die 200.

Figure 15:
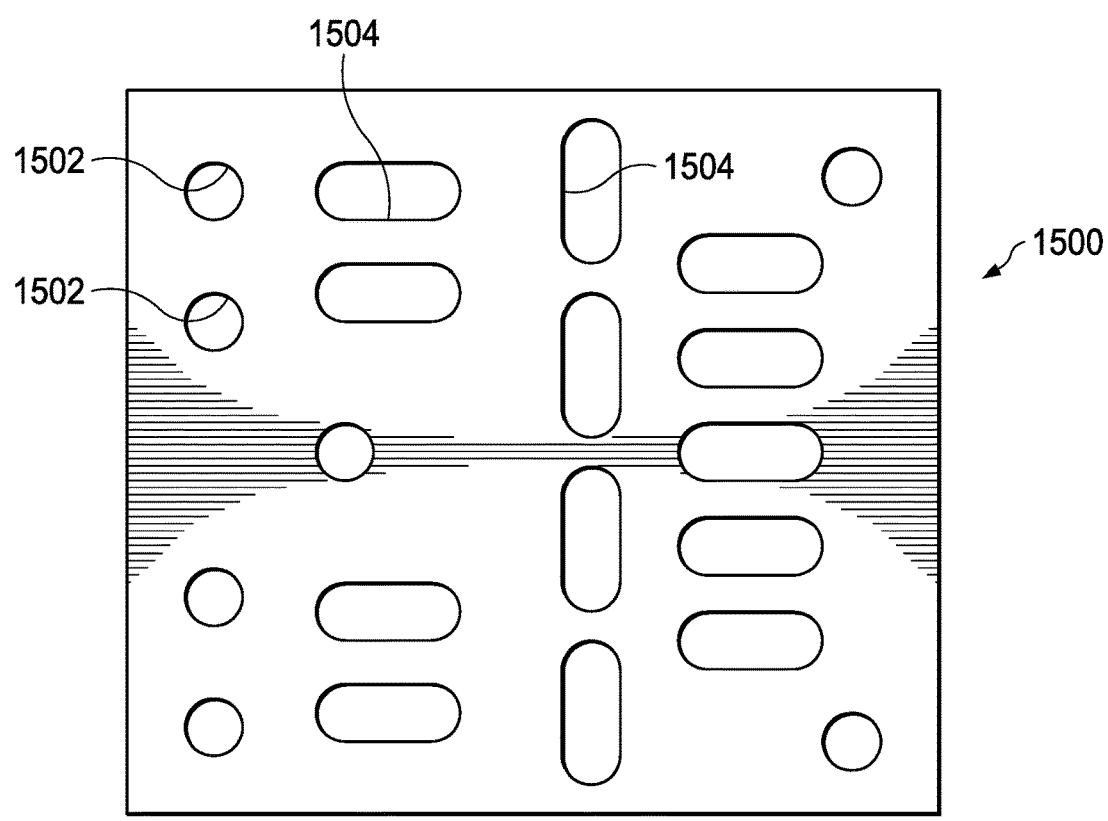
FIG. 15 shows a reticle pattern applied to remove the photoresist material from all bump locations in accordance with various examples.

FIG. 15 shows an example of a reticle pattern 1500 that may be applied to remove the photoresist material 702 from all bump locations (e.g., opening 206 and opening 208) of the integrated circuit die 200. The reticle pattern 1500 includes opening 1502 that corresponds to the opening 206 and opening 1504 that corresponds to the opening 208.

Figure 9:
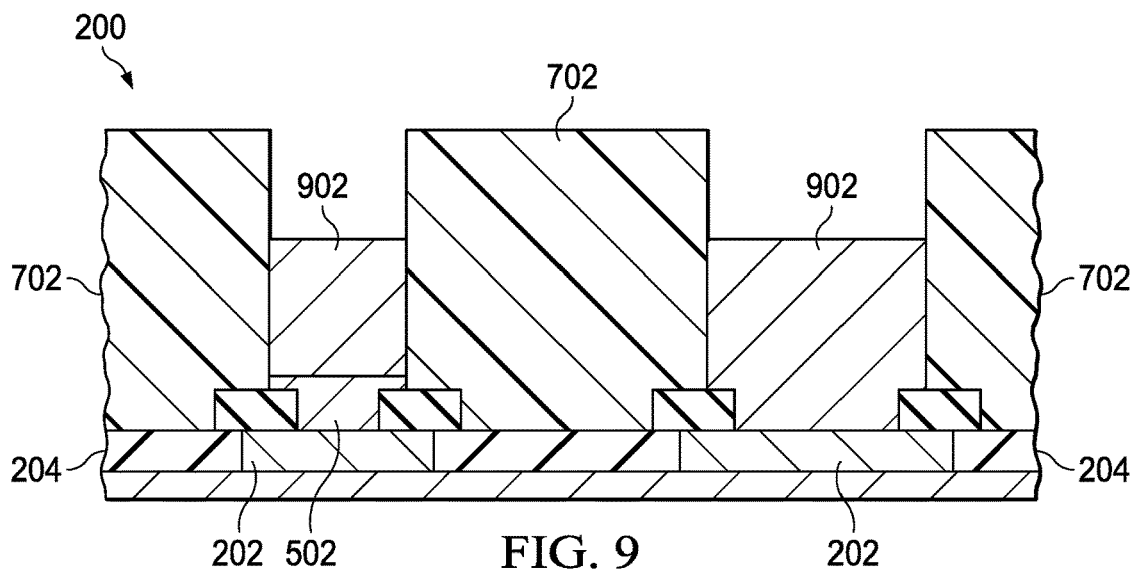
FIG. 9 shows the die with a layer of metal applied to all bump locations in accordance with various examples.

In block 114, a layer of metal is deposited at the opening 208 and on the layer of metal 502 at the opening 206 to form a bump (i.e., a metal post) at the opening 208 and to increase the height of the bump (i.e., the metal post) at the opening 206. FIG. 9 shows a layer of metal 902 deposited at the opening 208 and on the layer of metal 502 at the opening 206. The layer of metal 902 is a same metal as the layer of metal 502. For example, the layer of metal 502 and the layer of metal 902 are copper in some Implementations. The thickness of the layer of metal 902 is selected to produce a bump at the opening 208 of a given height. Because of the layer of metal 902 adds to the layer of metal 502, the bump formed at the opening 206 is substantially the same height as (e.g., coplanar with) the bump formed at the opening 208, while the volume of the bump formed at the opening 208 is greater than the volume of the bump formed at the opening 206.

Figure 10:
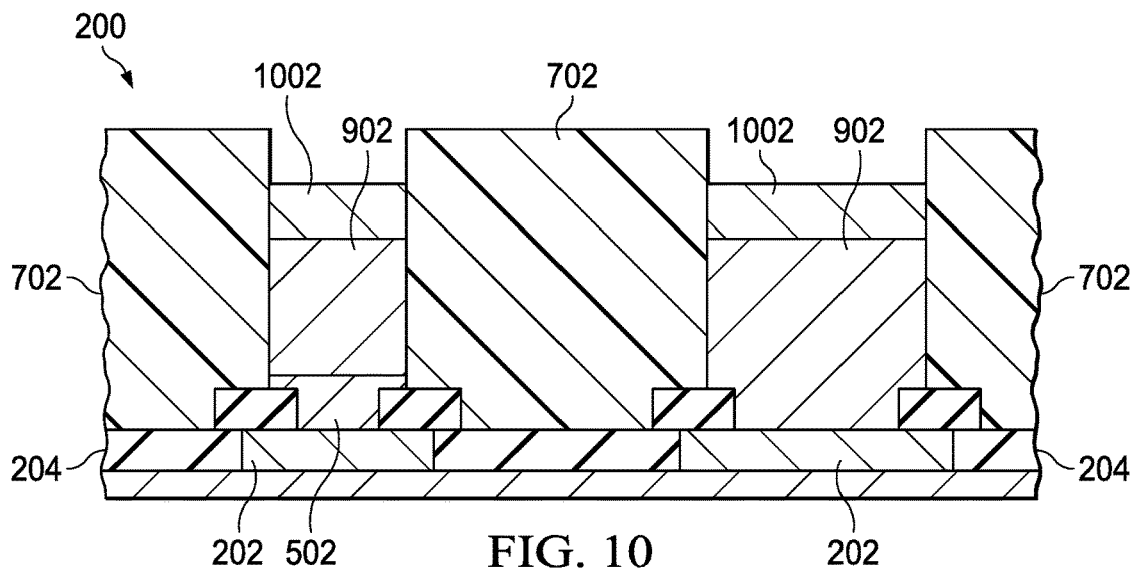
FIG. 10 shows a layer of solder applied to all bump locations in accordance with various examples.

A layer of solder may be deposited atop the layer of metal 902 to facilitate conductive connection of the die 200 to other circuits when the solder is reflowed. FIG. 10 shows a layer of solder 1002 deposited top the layer of metal 902 at the opening 206 and the opening 208.

Figure 11:
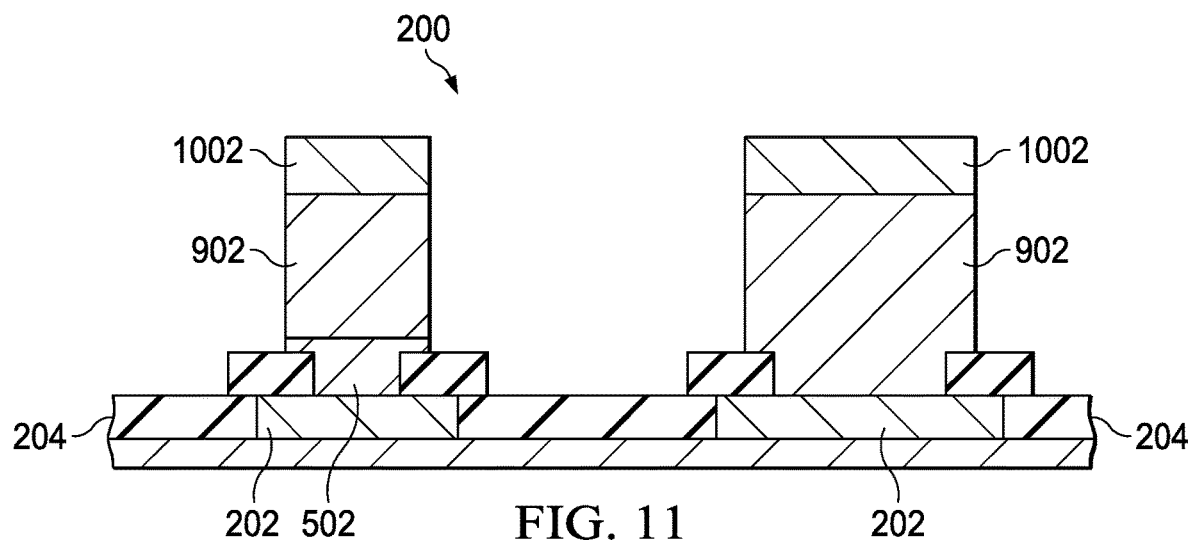
FIG. 11 shows the die with photoresist material removed to expose bumps in accordance with various examples.

In block 116, the photoresist material 702 is removed from the integrated circuit die 200 to expose the bumps formed at the opening 206 and the opening 208. FIG. 11 shows the photoresist material 702 removed from the die 200 to expose the bumps formed at the opening 206 and the opening 208.

Figure 12:
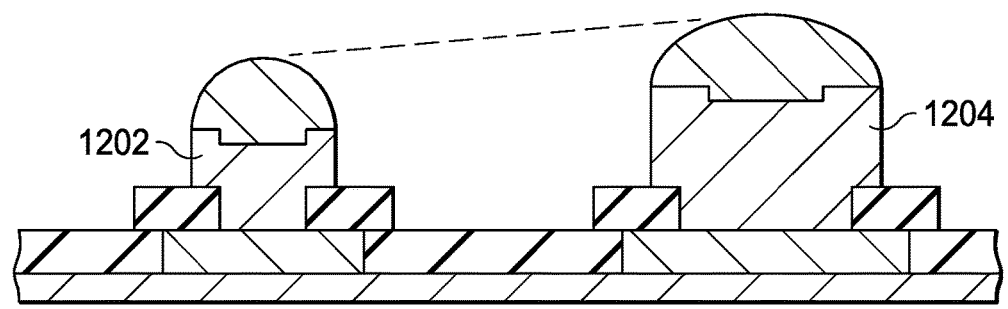
FIG. 12 shows varying bump height caused by different cross-sectional bump areas.

FIG. 12 shows a die 1200 that was not manufactured in accordance with the method 100 after solder reflow. The cross-sectional area of the bump 1202 is smaller than the cross-sectional area of the bump 1204. Consequently, the height of the bump 1202 is less than the height of the bump 1204 which may result in misconnection of the bump 1202 to an underlying pad or cause the die 1200 to be tilted relative to the underlying substrate.

Figure 13:
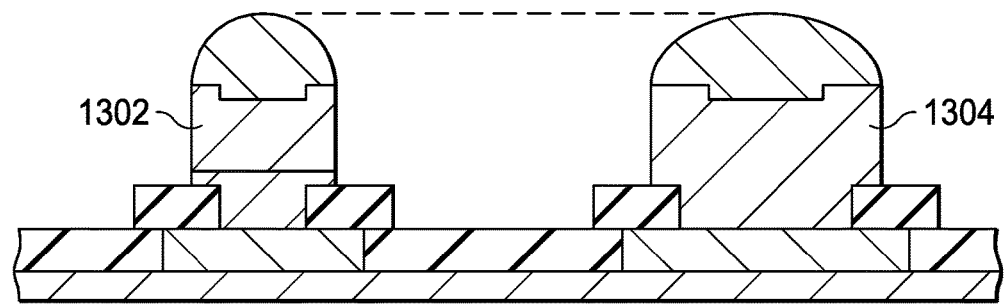
FIG. 13 shows bumps with different cross-sectional areas and a same height in accordance with various examples.

FIG. 13 shows a die 1300 that was manufactured in accordance with the method 100 after solder reflow. Even though the cross-sectional area of the bump 1302 is smaller than the cross-sectional area of the bump 1304, the height of the bump 1302 is the same as the height of the bump 1304 due to the compensation provided by the method 100. As a result, misconnection of the bump 1302 to an underlying pad or tilt of the die 1300 relative to the underlying substrate is avoided.

Figure 16:
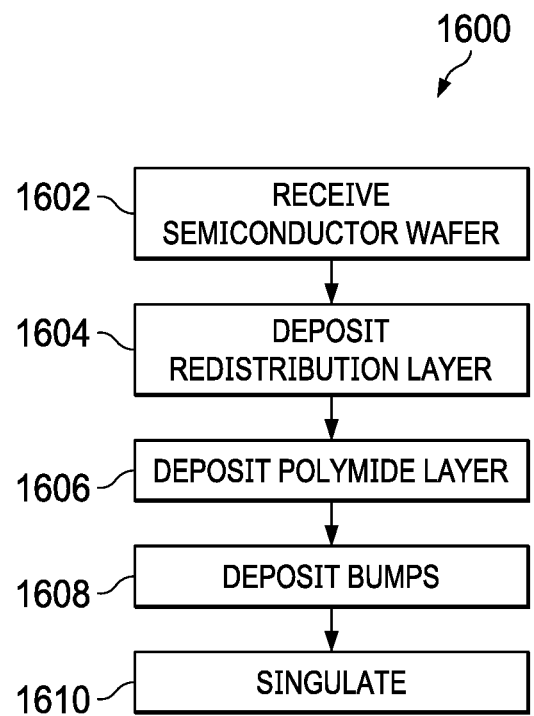
FIG. 16 shows a flow diagram for a method for packaging an integrated circuit in accordance with various examples.

FIG. 16 shows a flow diagram for a method 1600 for bump completion and singulation in accordance with various examples. Though depicted sequentially as a matter of convenience, at least some of the actions shown can be performed in a different order and/or performed in parallel. Additionally, some Implementations may perform only some of the actions shown.

In block 1602, a semiconductor wafer is received. For example, a semiconductor wafer produced in a semiconductor wafer factory may be received by a semiconductor packaging facility that is to package the die provided on the semiconductor wafer.

In block 1604, a redistribution layer is deposited on the semiconductor wafer. The redistribution layer provides conductors for connecting the input/output pads of each die of the semiconductor wafer to a location at which a bump is to be deposited. Deposition of the redistribution layer may include depositing a layer of photoresist material on the semiconductor wafer, and applying lithography to remove the photoresist material from the locations of input/output pads of each die formed on the semiconductor wafer. A layer of metal is deposited on the photoresist material. A layer of photoresist material is deposited on the metal layer and lithography is applied to pattern the photoresist material for formation of conductive traces that connect the input/output pads of each die to a location at which a bump is to be deposited. The layer of photoresist material and the layer of metal are removed in accordance with the pattern applied to the photoresist to form the conductive traces that connect the input/output pads of each die to a location at which a bump is to be constructed.

In block 1606, a layer of photoresist material (e.g., a layer of polyimide) is deposited on the semiconductor wafer. Lithography is applied to pattern the photoresist material for exposure of the metal deposited in block 1604 at the locations at which each bump is to be constructed. The photoresist is removed from each location at which a bump is to be constructed.

In block 1608, bumps are deposited on the semiconductor wafer in accordance with the method 100. By applying the method 100 to deposit the bumps, the height of the bumps is consistent with varying cross-sectional area.

In block 1610, the dice are singulated from the semiconductor wafer.

After singulation of the dice from the wafer, each die may be attached (e.g., by reflow of the bumps, to a substrate, and encapsulated in a mold compound.

Figure 17:
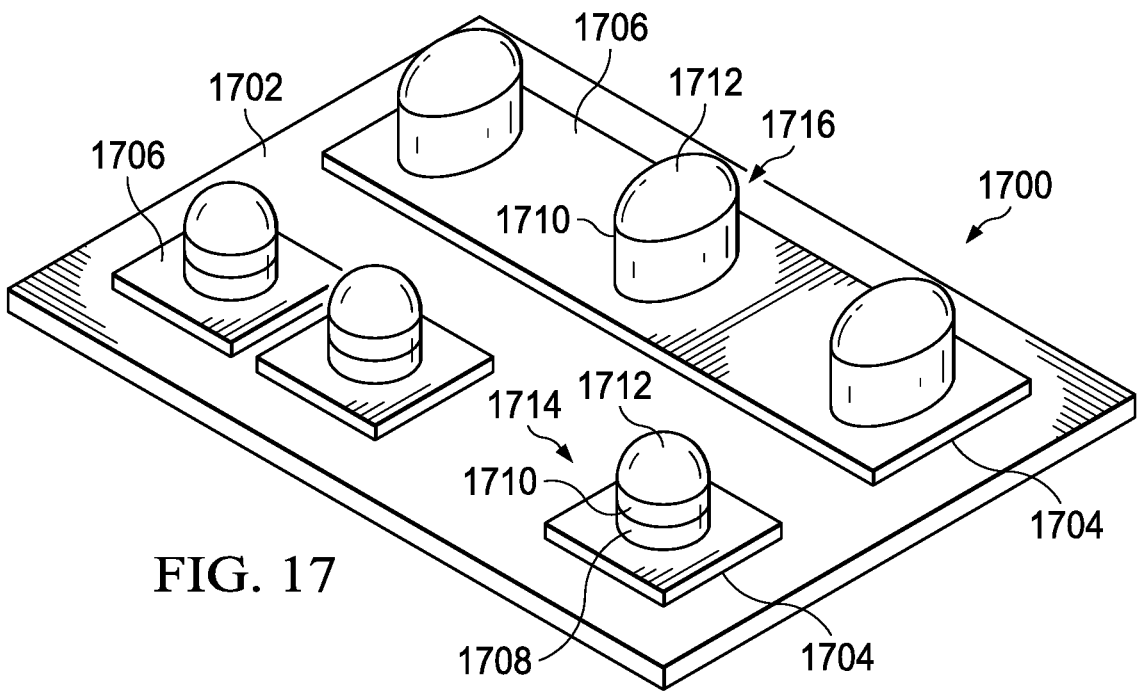
FIG. 17 shows a singulated integrated circuit with completed bumps in accordance with various examples.

FIG. 17 shows an integrated circuit package 1700 in accordance with various examples. The integrated circuit package 1700 includes an integrated circuit die 1702, a redistribution layer 1704, a polyimide layer 1706, bumps 1714 having a first cross-sectional area, and bumps 1716 having a second cross-sectional area. The cross-sectional area of bumps 1716 is greater than the cross-sectional area of bumps 1714. The polyimide layer 1706 is disposed over the metal of the redistribution layer 1704.

The bump 1714 includes a first copper layer 1708 and a second copper layer 1710 deposited on the redistribution layer 1704. The bump 1716 includes the second copper layer 1710 deposited on the redistribution layer 1704 (i.e., the bump 1716 does not include the first copper layer 1708). The bumps 1714 and 1716 include solder 1712 (e.g., tin/silver solder) deposited on the second copper layer 1710.

The above discussion is meant to be illustrative of the principles and various examples of the present invention. Numerous variations and modifications will become apparent to those skilled in the art once the above disclosure is fully appreciated. It is intended that the following claims be interpreted to embrace all such variations and modifications.

What is claimed is:

1. A method for manufacturing an integrated circuit (IC) package, comprising:
depositing a first layer of metal at a first location on a redistribution layer of an IC die; and
depositing a second layer of metal at the first location on the first layer of metal, and at a second location on the redistribution layer of the IC die, the second location of the redistribution layer not including the first layer of metal, wherein a cross sectional area of the second layer of metal on the first layer of metal is different than the cross sectional area of the second layer of metal at the second location on the second redistribution layer.

2. The method of claim 1, wherein the cross sectional area of the second layer of metal on the first layer of metal, and the cross sectional area of the second layer of metal on the second location on the redistribution layer are from a top view of the IC package.

3. The method of claim 1, wherein the cross sectional area of the second layer of metal on the first layer of metal has a circular shape, and the cross sectional area of the second layer of metal at the second location on the redistribution layer has an oval shape.

4. The method of claim 1, wherein the first layer of metal and the second layer of metal include copper.

5. The method of claim 1 further comprising depositing solder on the second layer of metal on the first layer of metal, and on the second layer of metal on the second location on the redistribution layer of the IC die.

6. The method of claim 1 further comprising, prior to depositing the first layer of metal, applying a layer of photoresist material to the first location on the redistribution layer and the second location on the redistribution layer.

7. The method of claim 6 further comprising:
removing the layer of photoresist material from the first location on the redistribution layer; and
retaining the layer of photoresist material at the second location on the redistribution layer.

8. The method of claim 6 further comprising, after depositing the first layer of metal, applying a layer of photoresist material to the first location on the first layer of metal and the second location on the redistribution layer.

9. The method of claim 1, wherein the first layer of metal and the second layer of metal are the same metal.

10. A method for manufacturing an integrated circuit (IC) package, comprising:
depositing, in a first step, a first layer of a metal on a first metal post of an IC die; and
depositing, in a second step, a second layer of the metal on the first layer of the metal of the first metal post, and a third layer of the metal on a second metal post of the IC die, the second metal post not including the first layer of the metal; wherein the first metal post has a round shape and the second metal post has an oval shape, from a top view of the IC package.

11. The method of claim 10, wherein the second layer of the metal and the third layer of the metal are deposited concurrently.

12. The method of claim 10, wherein after depositing the second layer of the metal on the first layer of the metal, and the third layer of the metal on the second metal post of the IC die, a height of the second layer of the metal and the first layer of the metal together on the first metal post, and a height of the third layer of the metal on the second metal post are substantially the same.

13. The method of claim 10, where a cross-sectional area of the first metal post is smaller than a cross-sectional area of the second metal post.

14. The method of claim 10, wherein the first layer of the metal, the second layer of the metal, and the third layer of the metal include copper.

15. The method of claim 10 further comprising depositing solder on the second layer of the metal and the third layer of the metal.

16. The method of claim 10, wherein the third layer of the metal is deposited directly on the second metal post.

17. The method of claim 10, wherein the first metal post and the second metal post include redistribution layers of the IC die.

* * * * *